(12) United States Patent
Ahmad et al.

(10) Patent No.: US 12,117,556 B2
(45) Date of Patent: Oct. 15, 2024

(54) FIELD-AWARE METAL FILLS FOR INTEGRATED CIRCUIT PASSIVE COMPONENTS

(71) Applicant: TEXAS INSTRUMENTS INCORPORATED, Dallas, TX (US)

(72) Inventors: Zeshan Ahmad, Plano, TX (US); Samala Sreekiran, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 573 days.

(21) Appl. No.: 17/360,161

(22) Filed: Jun. 28, 2021

(65) Prior Publication Data

US 2022/0413091 A1 Dec. 29, 2022

(51) Int. Cl.
| | |
|---|---|
| *H01L 23/528* | (2006.01) |
| *G01S 7/03* | (2006.01) |
| *G01S 13/04* | (2006.01) |
| *H01L 23/522* | (2006.01) |
| *H03F 3/195* | (2006.01) |

(52) U.S. Cl.
CPC .............. *G01S 7/032* (2013.01); *G01S 13/04* (2013.01); *H01L 23/5227* (2013.01); *H01L 23/528* (2013.01); *H03F 3/195* (2013.01); *H03F 2200/451* (2013.01)

(58) Field of Classification Search
CPC .... H01L 23/5227; H01L 23/528; G01S 7/032
See application file for complete search history.

(56) References Cited

U.S. PATENT DOCUMENTS

| | | | |
|---|---|---|---|
| 9,583,554 B1* | 2/2017 | Ler | H01L 27/0207 |
| 11,380,627 B1* | 7/2022 | Chen | H01L 29/402 |
| 2012/0091558 A1* | 4/2012 | Loke | H01L 27/0617 257/E29.325 |
| 2012/0092121 A1* | 4/2012 | Jin | H01L 23/5227 336/232 |
| 2012/0319237 A1* | 12/2012 | Cooney, III | H01L 23/528 438/618 |
| 2013/0157587 A1* | 6/2013 | Blanchet | H01F 27/2804 336/200 |
| 2014/0062641 A1* | 3/2014 | Chen | H01L 28/10 29/25.01 |
| 2014/0159854 A1* | 6/2014 | Samala | H01F 17/0006 336/84 C |
| 2016/0365189 A1* | 12/2016 | Jin | H01L 23/5227 |
| 2017/0093362 A1* | 3/2017 | Jin | H01L 23/5223 |
| 2019/0189608 A1* | 6/2019 | Cheng | H01L 28/90 |
| 2019/0348410 A1* | 11/2019 | Roig-Guitart | H01C 7/1013 |
| 2020/0066829 A1* | 2/2020 | Cheng | H01F 27/38 |
| 2020/0127627 A1* | 4/2020 | Trang | H01L 23/5222 |
| 2020/0279908 A1* | 9/2020 | Siprak | H01L 23/5227 |
| 2021/0218365 A1* | 7/2021 | Leng | H03B 5/12 |
| 2021/0288177 A1* | 9/2021 | Nishiwaki | H01L 29/1095 |
| 2021/0320053 A1* | 10/2021 | Jiang | H01L 24/42 |
| 2021/0384122 A1* | 12/2021 | Leng | H01L 28/10 |
| 2022/0238436 A1* | 7/2022 | Lee | H01F 17/0013 |

* cited by examiner

*Primary Examiner* — Nathan W Ha
(74) *Attorney, Agent, or Firm* — Michael T. Gabrik; Frank D. Cimino

(57) ABSTRACT

An integrated circuit includes a passive component having a first metal feature and a second metal feature, the first metal feature and the second metal feature defining an interior area therebetween. The integrated circuit also includes set of spaced metal fill lines extending across the interior area and oriented to carry current orthogonal to current carried by the first metal feature and second metal feature.

20 Claims, 7 Drawing Sheets

FIELD-AWARE METAL FILLS FOR INTEGRATED CIRCUIT PASSIVE COMPONENTS

BACKGROUND

The proliferation of electronic devices and integrated circuit (IC) technology has resulted in the commercialization of IC products. As new electronic devices are developed and IC technology advances, new IC products are commercialized. One example IC product includes integrated inductors and/or transformers. For example, an IC with a voltage-controlled oscillator (VCO) may include an integrated inductor, where the VCO performance is affected by the quality factor (Q) of the inductor. Such VCOs are used in many IC products, with some IC products being more sensitive to inductor performance issues. In one example, reduced inductor or transformer performance may result in VCO noise or other issues that reduce the multi-object detection accuracy of a radar IC.

The fabrication complexity of advanced silicon processes imposes several restrictions on an integrated circuit design such as maximum polysilicon-gate pitch, device orientation, and back-end of the line (BEOL) metal density. The BEOL metal density restriction in particular severely degrades the performance of integrated passives such as inductors, transformers, and antennas. Most critical is the degradation of the Q of these structures due to unwanted eddy-currents leading to higher insertion loss (IL) in the matching networks and phase-noise erosion in related VCOs. Furthermore, design-for-manufacturability (DFM) compliant metal fills impact the inductance and the self-resonance frequency (SRF) of passive inductor components causing further performance degradations. The impact of these degradations is more pronounced as the frequency of operation increases where the loss in circuit performance incurred due to Q/IL/SRF degradation cannot be easily compensated by higher device gain which itself is limited due to the ft/fmax ("ft" refers to the frequency at which current gain falls to unity or zero dB, and "fmax" is the frequency at which unilateral gain (U) becomes unity, or zero dB).

SUMMARY

In at least one example, an integrated circuit comprises a passive component having a first metal feature and a second metal feature extending in parallel to the first metal feature. The first metal feature and the second metal feature define an interior area extending therebetween. A set of spaced metal fill lines extend across the interior area and are oriented to carry current orthogonal to current carried by the first metal feature and second metal feature.

In another example, a system comprises: a power management circuit; and an integrated circuit coupled to the power management circuit. The integrated circuit includes: circuitry with a passive component having a metal layer with first and second metal features, each of the first and second metal features having an interior edge and an exterior edge. The interior edges of the first and second metal features define an interior area between the first and second metal features. The integrated circuit also includes spaced metal fill lines extending across the interior area and oriented to carry current orthogonal to current carried by the first and second metal features. The system also includes another circuit coupled to the integrated circuit, wherein the other circuit is configured to receive a signal from the integrated circuit responsive to operations of the circuitry.

BRIEF DESCRIPTION OF THE DRAWINGS

The same reference numbers are used in the drawings to depict the same or similar (functionally and/or structurally) features.

DETAILED DESCRIPTION

Described herein is an integrated circuit (IC) technology, referred to herein as field-aware metal fills, to reduce the effect of metal fills on the performance of integrated passive components, such as inductors, transformers, antennas, and related circuitry. As used herein, "field-aware metal fills" refer to metal fills with features (e.g., pitch, dimensions, orientation) that account for ambient magnetic fields due to current flow in an IC. With appropriate features, field-aware metal fills are able to reduce the effects of metal fills on the performance of integrated passive components or related circuitry. By exploiting the differential current flow and field-orthogonality, field-aware metal fills are design-for-manufacturability (DFM) compliant and minimize the impact of the eddy-currents on the passive components. In addition, field-aware metal fills simultaneously minimize the blocking of the natural electromagnetic field of the structure, which is an improvement over conventional designs. Both of these aspects ensure negligible degradation of the quality-factor (Q), inductance, and self-resonance frequency (SRF) of the post metal-fill structure. These improvements avoid time and resource consuming design iterations.

Example circuitry that benefits from the use of field-aware metal fills include oscillators (e.g., voltage-controller oscillators (VCOs)) and amplifiers. An example IC that includes field-aware metal fills and integrated passive components is a radar control IC. The radar control IC may be used in a system, such as an automotive radar system to provide multi-object radar detection or other operations. With field-aware metal fills, the negative effect of metal fills on passive components and related operations is reduced, which improves related parameters (e.g., Q, inductance, and/or SRF is increased). An example effect of field-aware metal fills in a radar control IC is that the accuracy of multi-object radar detection of radar control IC is improved. Another example use of field-aware metal fills is to reduce the size of passive components or avoid a larger passive component. Another example effect of field-aware metal fills is to improve signal-to-noise ratio (SNR) or other performance parameters of a wireless transceiver.

Figure 1:
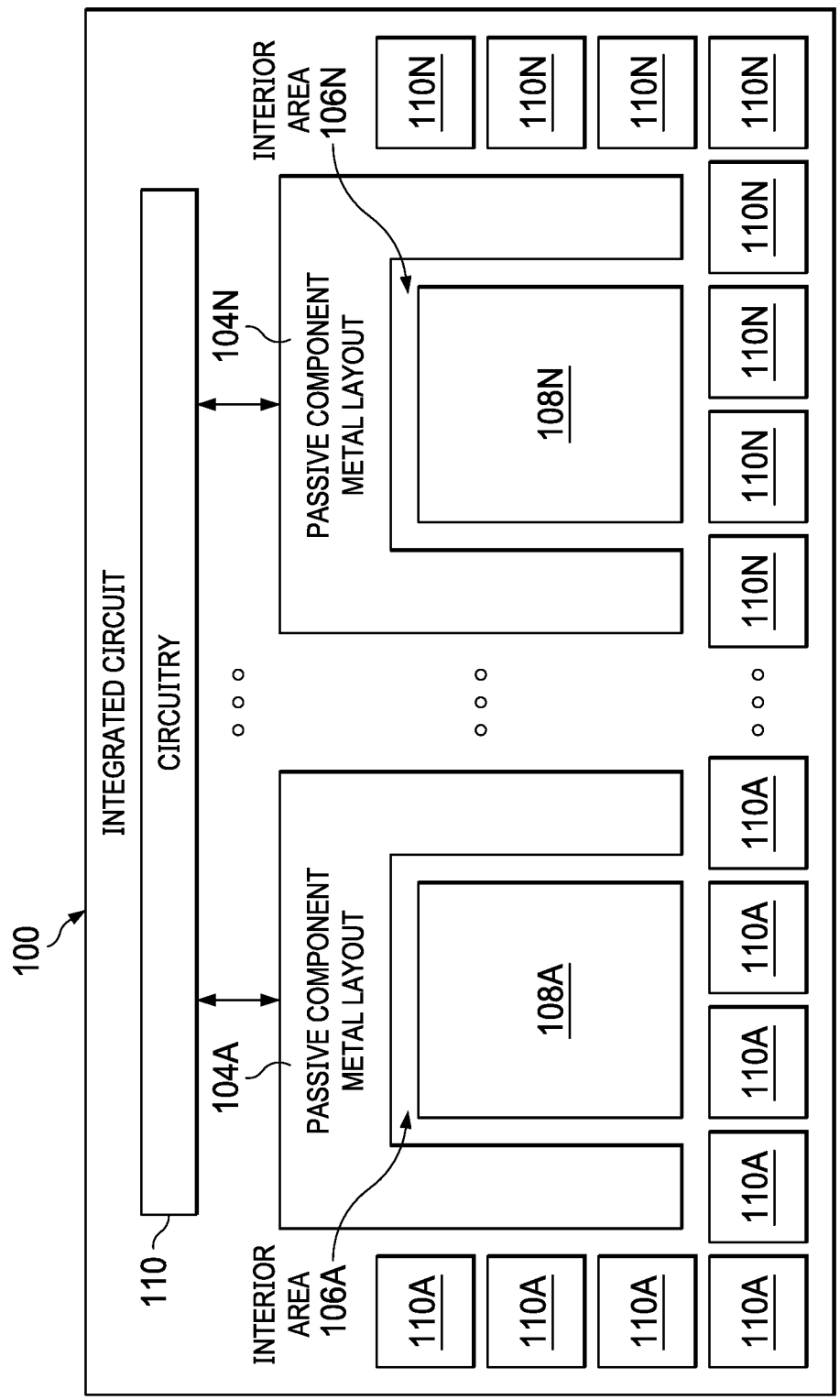
FIG. 1 is a block diagram of an integrated circuit (IC) with passive components and field-aware metal fills in accordance with an example embodiment.

FIG. 1 is a block diagram of an IC 100 with passive components having respective passive component metal layouts 104A-104N and field-aware metal fills in accordance with an example embodiment. In different examples, the passive component metal layouts 104A-104N form inductors, transformers, or antennas. Also, each of the passive component metal layouts 104A-104N may include a single turn or multiple turns. As shown, the passive component metal layouts 104A-104N are coupled to circuitry 110. In some examples, the circuitry 110 includes oscillator circuitry (e.g., a VCO) coupled to at least one of the passive component metal layouts 104A-104N to form an oscillator. Additionally or alternatively, the circuitry 110 includes amplifier circuitry coupled to at least one of the passive component metal layouts 104A-104N to form an amplifier.

In the example of FIG. 1, each of the passive component metal layouts 104A-104N includes a respective interior area 106A-106N. In different examples, the shape of each respective passive component metal layout 104A-104N and each respective interior area 106A-106N may vary. Example shapes for the passive component metal layouts 104A-104N and respective interior areas 106A-106N include squares, rectangles, polygons, circles, or other shapes.

In some example embodiments, the IC 100 includes a respective one of the interior field-aware metal fill arrays 108A-108N for each of the passive component metal layouts 104A-104N. In other example embodiments, a respective one of the interior field-aware metal fill arrays 108A-108N is not included for each of the passive component metal layouts 104A-104N (e.g., some passive component metal layouts 104A-104N have a respective interior field-aware metal fill array and some do not). As an example, the interior field-aware metal fill array 108A includes a first array of spaced metal fill lines (e.g., the array 530 in FIG. 5) that extend across the interior area 106A. The spaced metal fill lines of the first array of metal fill lines are oriented to carry current orthogonal to current carried by parallel metal features of the passive component metal layout 104A. Design rules for a given fabrication technology may specify nominal, minimum, and/or maximum pitch and width for the metal fill lines in the interior arrays. In some application, the widths of the spaced metal fill lines are at or near the minimum width to ensure current flows orthogonal to current flow in the metal features of the passive component metal layout 104A. Similarly, each of the interior field-aware metal fill arrays 108B-108N includes an array of spaced metal fill lines that extend across the respective interior areas 106B-106N with respective orientation, pitch, width, or other features determined in a manner similar to the spaced metal fill lines described for the interior field-aware metal fill array 108A.

In contrast to the interior field-aware metal fill arrays 108A-108N, the exterior field-aware metal fill array(s) 110A-110N are exterior to the respective passive component metal layouts 104A-104N. As an example, the exterior field-aware metal fill array(s) 110A includes a second array of spaced metal fill lines (e.g., array 602 in FIG. 6) that extend across a first exterior area (not shown) along an exterior edge of a first metal feature of the passive component metal layout 104A. Additionally or alternatively, the exterior field-aware metal fill array(s) 110A includes a third array of spaced metal fill lines (e.g., array 608 in FIG. 6) that extend across a second exterior area (not shown) along an exterior edge of a second metal feature of the passive component metal layout 104A. The spaced metal fill lines of the second and/or third array of spaced metal fill lines are oriented to carry current orthogonal to current carried by the metal features of the passive component metal layout 104A. In addition, the pitch of the spaced metal fill lines of the second and/or third array of spaced metal fill lines should comply with fabrication specifications for metal fill. The design rules may specify nominal, minimum, and/or maximum pitch and width for the metal fill lines of the exterior arrays 110A-110N, and these may be the same or different from the values specified for the metal fill lines of the interior arrays 108A-108N. In some applications, the width of the spaced metal fill lines of the second and/or third array of spaced metal fill lines are at or near the minimum width to ensure current flows orthogonal to current flow in the metal features of the passive component metal layout 104A. Similarly, each of the exterior field-aware metal fill array(s) 110B-108N includes one or more arrays of spaced metal fill lines that extend across respective exterior areas with a respective orientation, pitch, width, or other features determined in a manner similar to the spaced metal fill lines of the second and/or third array of spaced metal fill lines described for the exterior field-aware metal fill array 110A.

Figure 2:
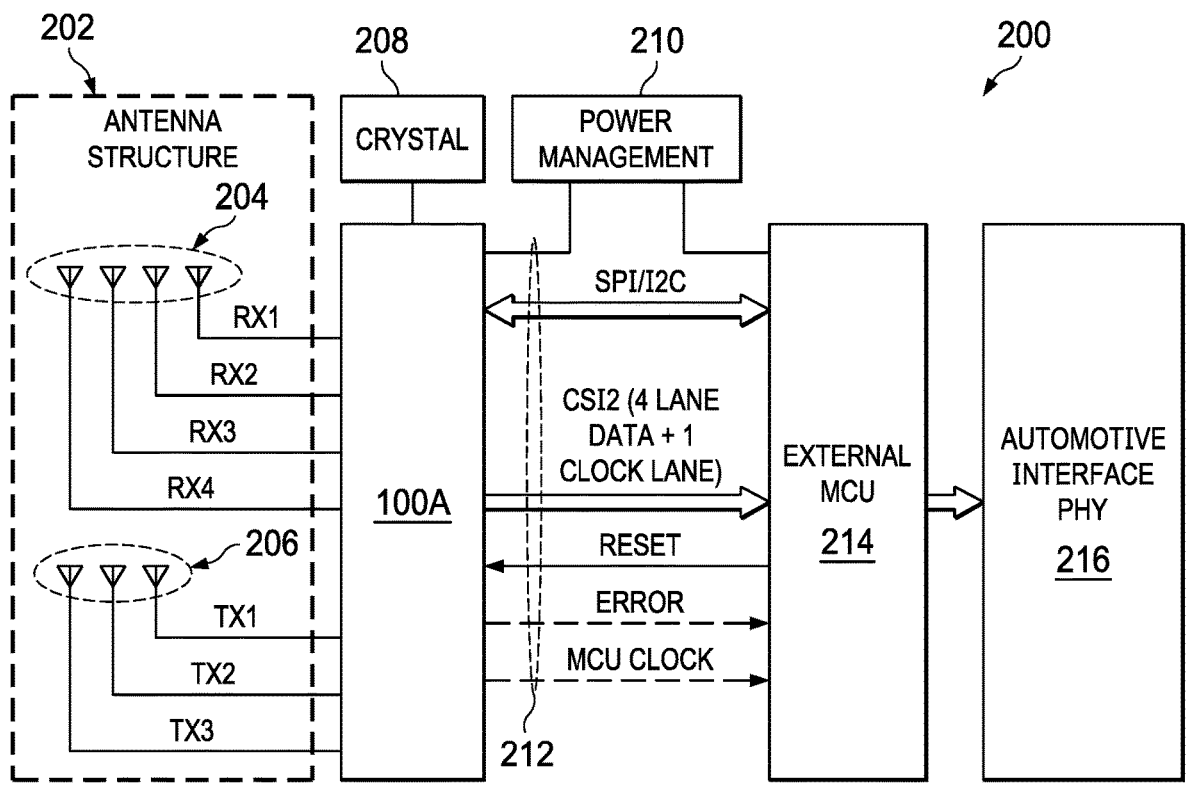
FIG. 2 is a diagram of a radar system in accordance with an example embodiment.

FIG. 2 is a diagram of a radar system 200 in accordance with an example embodiment. The radar system 200 is an example of a vehicle radar system or other radar system. As shown, the radar system 200 includes an IC 100A (an example of the IC 100 in FIG. 1) with passive component metal layouts and field-aware metal fills as described herein. The IC 100A is coupled to a set of antenna 202 including receive antennas 204 (labeled RX1-RX4) and transmit antennas 206 (labeled TX1-TX3). The IC 100A is coupled to a crystal 208 or other high-speed frequency source. The radar system 200 also includes a power management circuit 210 (e.g., a battery and voltage converters) coupled to the IC 100A and an external microcontroller (MCU) 214. In the example of FIG. 2, the external MCU 214 is coupled to an automotive interface physical layer (PHY) 216, which manages communications to other systems or sub-systems coupled to the radar system 200. An example radar system 200 with the IC 100A is an automotive radar operating in the 60-80 GHz range of the electromagnetic spectrum and, capable of a 4-5 GHz continuous tuning range within the 60-80 GHz range.

As shown, a set of signals 212 is conveyed as needed between the IC 100A and external MCU 214. In some example embodiments, the set of signals 202 includes: serial interface signaling using protocols such as serial peripheral interface (SPI) or I²C. The set of signals 202 also includes a camera serial interface (e.g., CSI2). In addition, the set of signals 202 includes reset signaling, error signaling and MCU clock signaling. In other example embodiments, the set of signals 202 may vary. In the example of FIG. 2, the IC 100A is a radar control IC configured to perform radar operations such as: providing transmit signals to one or more transmit antennas 206 of the set of antennas 202; receiving receive signals responsive to the transmit signals; analyzing the receive signals to determine object detection or related parameters; storing analysis results; and/or transferring receive signals, analysis data, or detection response signals to the external MCU 214. In different example embodiments, the particular operations performed by the radar control IC 100A and the external MCU 412 may vary. Regardless of the particular operations of the IC 100A, the overall performance of the IC 100A is a function of passive components and field-aware metal fills as described herein. In some example embodiments, the field-aware metal fills of the IC 100A improves certain passive component parameters (e.g., Q, inductance, and/or SRF) by reducing the negative effect of metal fills on these parameters. As an example, the field-aware metal fills of the IC 100A improves the performance of multi-object radar detection or other operations of the IC 100A.

Figure 3:
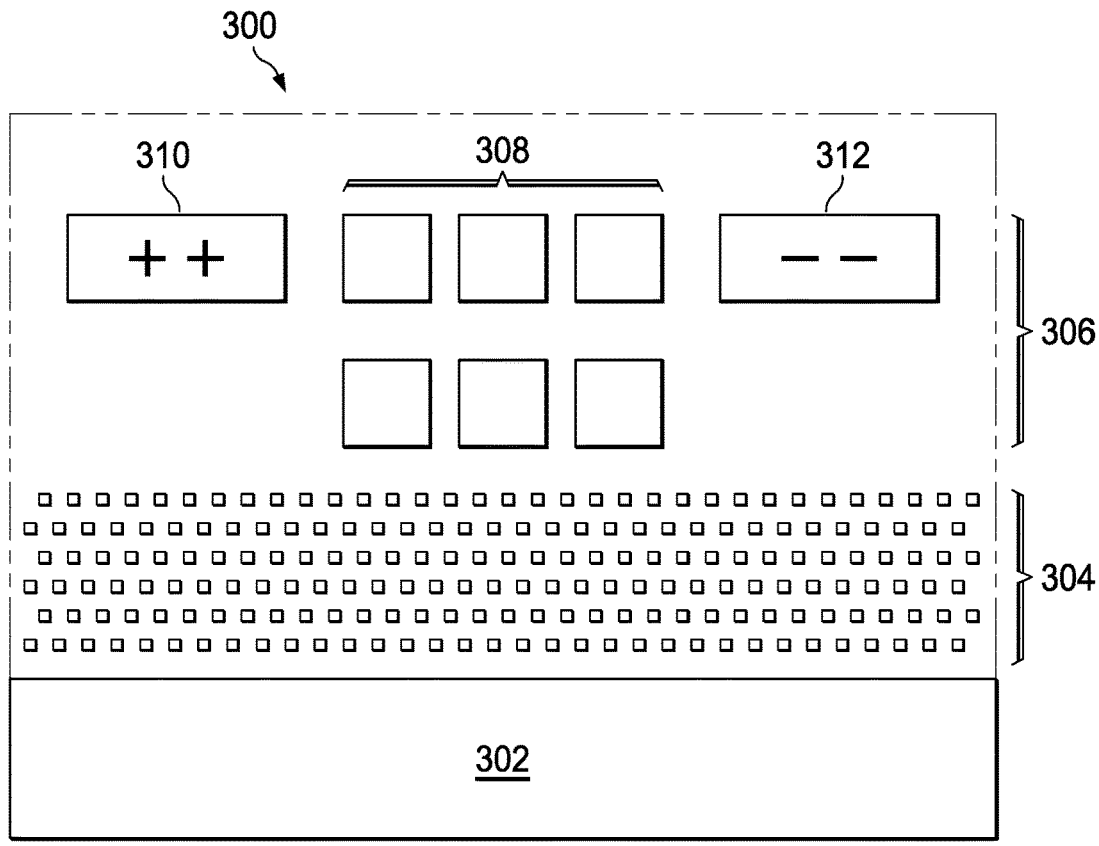
FIG. 3 is a diagram of IC layers in accordance with conventional technology.

FIG. 3 is a cross-sectional diagram 300 of IC layers in accordance with conventional technology. In the diagram 300, the IC layers include a substrate 302 (e.g., a silicon substrate), lower-level metal layers 304, and upper-level metal layers 306 disposed in layers of a dielectric material on top of the substrate 302. The thick metal layers 306 includes first and second metal features 310 and 312 of a passive component's metal layer. In addition, the thick metal layers 306 include metal fills 308 between the first and second metal features 310 and 312. While the metal fills 308 may promote fabrication of the related IC by adding rigidity and preventing dishing of the surrounding dielectric, depending on aspects of the configuration of these metal fills 308 such as thickness, spacing, and connection with other metal fills 308, parameters (e.g., Q, inductance, and/or SRF) of the passive component related to the first and second metal features 310 and 312 may be negatively affected.

Figure 4:
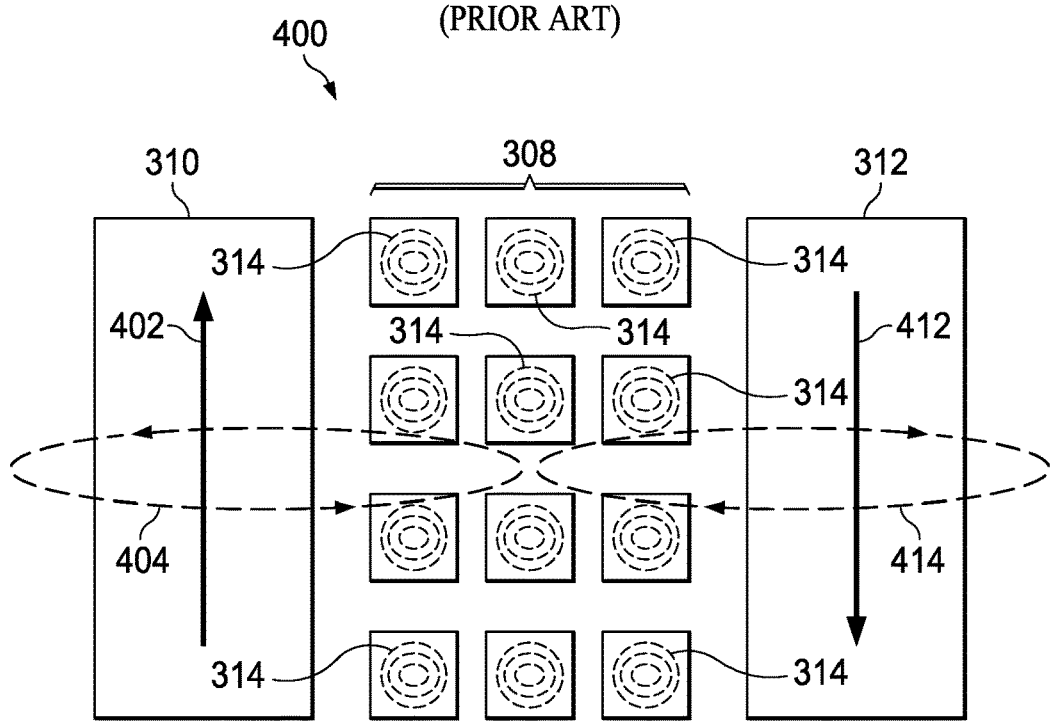
FIG. 4 is a top view of an IC layer of FIG. 3, related currents, and related magnetic fields in accordance with conventional technology.

FIG. 4 is a top view 400 of an IC layer of FIG. 3, related currents, and related magnetic fields in accordance with conventional technology. In the top view 400, the first and second metal features 310 and 312, and the metal fills 308 are shown. In addition, current flow 402 in the first metal feature 310 is in a first direction, while current flow 412 in the second metal feature 312 is in a direction opposite the first direction. The current flows 402 and 412 also result in magnetic fields 404 and 414 that extend into the metal fills 308, resulting in eddy current 314 in the metal fills 308. These eddy current 314 are oriented in a way that negatively affect parameters (e.g., Q, inductance, and/or SRF) of the passive component related to the first and second metal features 310 and 312.

Figure 5:
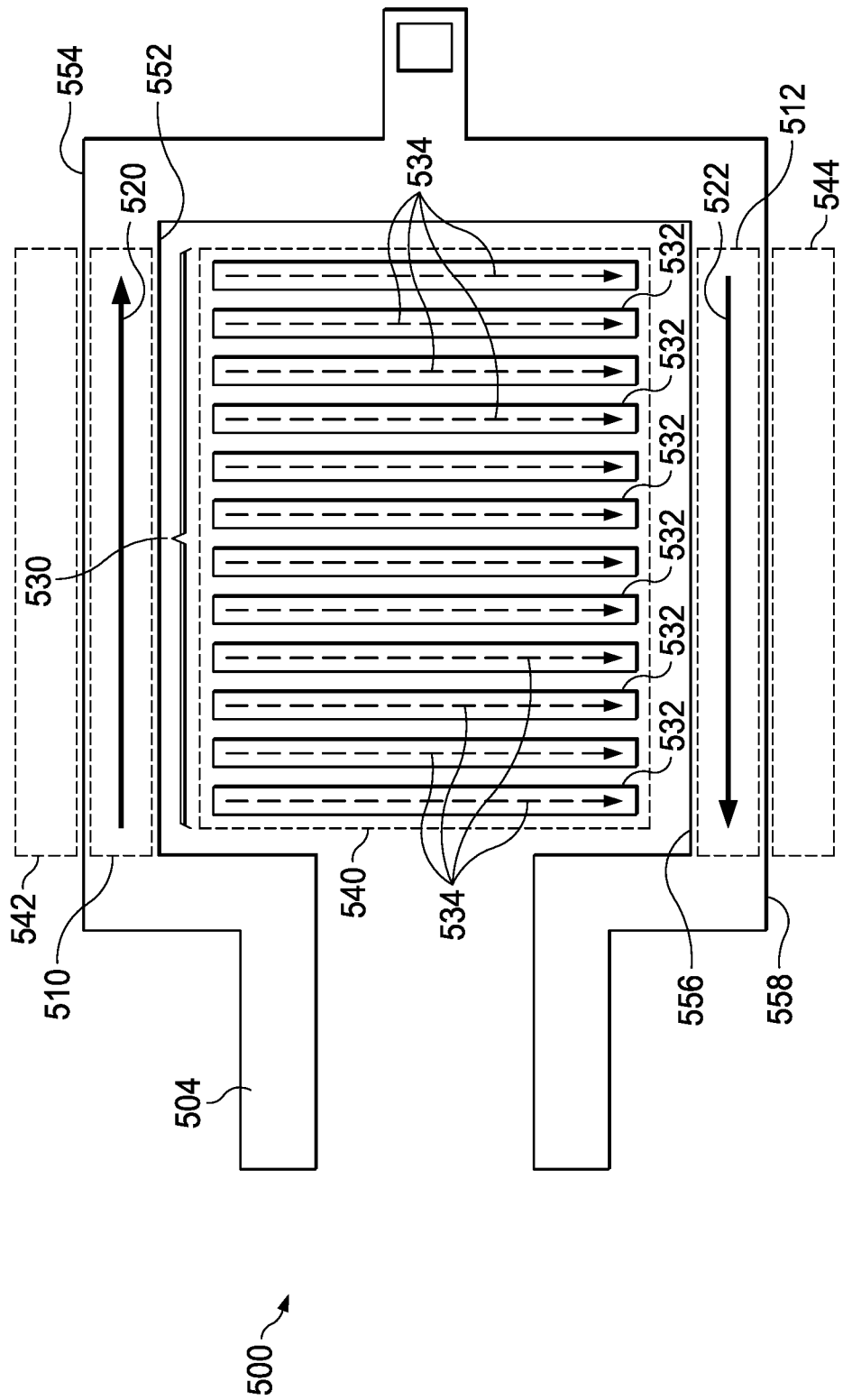
FIG. 5 is a top view of a passive component's metal layout and field-aware metal fills in accordance with an example embodiment.

FIG. 5 is a top view 500 of a first circuit that includes a passive component's metal layout 504 (an example of the metal layout 104 in FIG. 1) and field-aware metal fills (e.g., the interior field-aware metal fill array 530) in accordance with an example embodiment. As shown in the top view 500, the metal layout 504 includes a first metal feature 510 with a first interior edge 552 and a first exterior edge 554. The metal layout 504 also includes a second metal feature 512 with a second interior edge 556 and a second exterior edge 558 extending parallel to the first metal feature 510. In the example of FIG. 5, the first and second metal features 510 and 512 are configured to carry current 520 and 522 in opposite directions. Between the first and second metal features 510 and 512 is an interior area 540. Inside the interior area 540, there is an interior field-aware metal fill array 530 (an example of the interior field-aware metal fill array 108A in FIG. 1) with spaced metal fill lines 532. Specifically, each of the spaced metal fills 532 includes a metal fill line that extends across the interior area 540. With the orientation of the spaced metal fills 532, current flows 534 of the spaced metal fills 532 are orthogonal to the first and second metal features 510 and 512.

In the top view 500 of FIG. 5, a first exterior area 542 is shown along the first exterior edge 554 of the first metal feature 510. Also, a second exterior area 544 is shown along the second exterior edge 558 of the second metal feature 512. In the example of FIG. 5, the interior field-aware metal fill array 530 in the interior area 540 is used, while the first and second exterior areas 542 and 544 are empty. With the arrangement of FIG. 5, the interior field-aware metal fill array 530 may provide a sufficient reduction to the negative effects of metal fills on parameters (e.g., Q, inductance, and/or SRF) of the passive component related to the metal layout 504.

Figure 6:
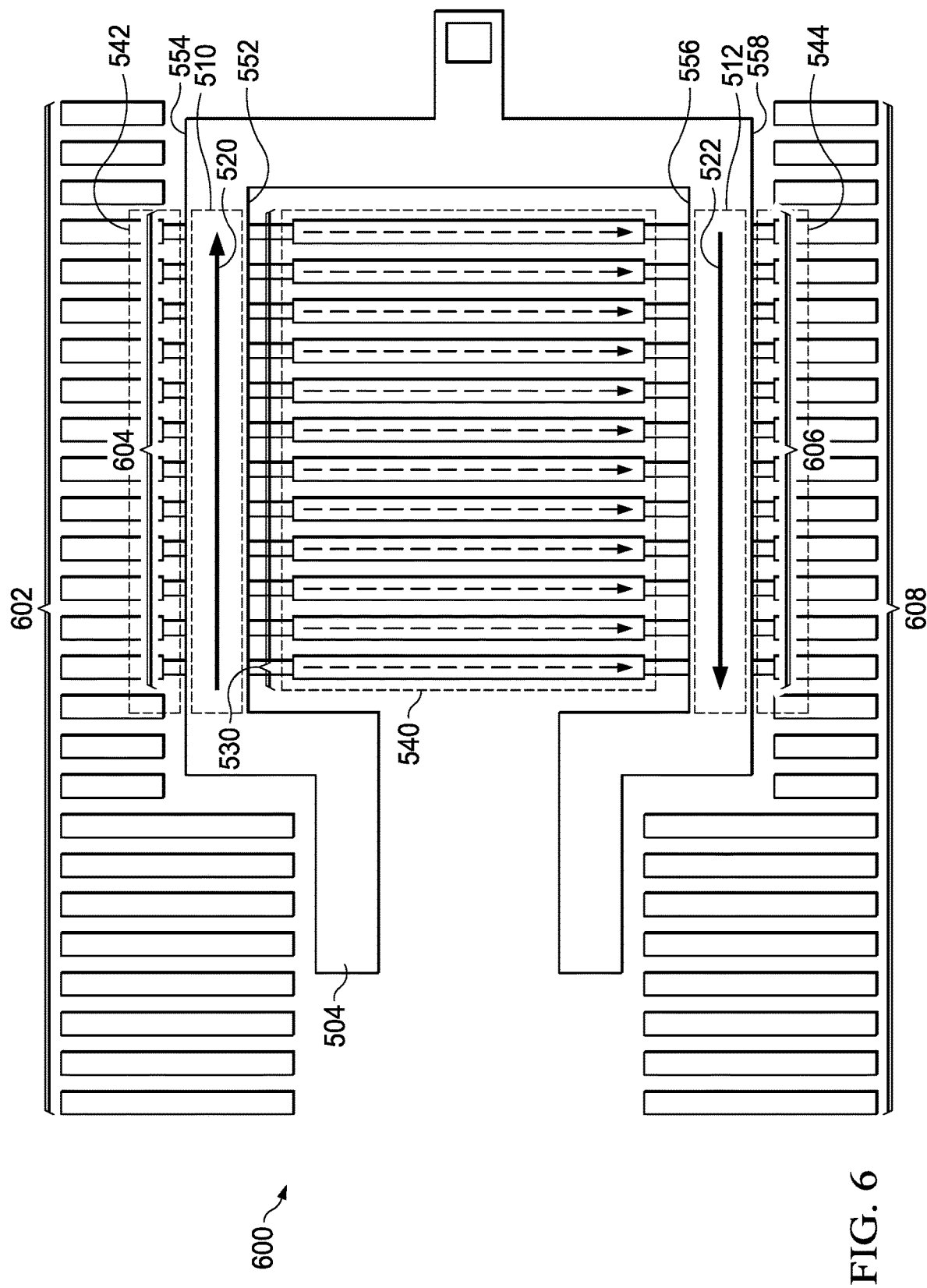
FIG. 6 is a top view of a passive component metal layout and field-aware metal fills in accordance with another example embodiment.

FIG. 6 is a top view 600 of a second circuit that includes the metal layout 504 (an example of the metal layout 104 in FIG. 1) and field-aware metal fills (e.g., the interior field-aware metal fill array 530 of FIG. 5, a first exterior field-aware metal fill array 602, and a second exterior field-aware metal fill array 604) in accordance with another example embodiment. In FIG. 6, the field-aware metal fills include the interior field-aware metal fill array 530, a first exterior field-aware metal fill array 602 with spaced metal fills extending across the first exterior area 542, and a second exterior field-aware metal fill array 608 with spaced metal fills extending across the second exterior area 544. In addition, the first exterior field-aware metal fill array 602 includes spaced metal fills outside the first external area 542. Also, the second exterior field-aware metal fill array 608 also includes spaced metal fills outside the second external area 544.

In the example of FIG. 6, the illustrated metal fills of the interior field-aware metal fill array 530, the first exterior field-aware metal fill array 602, and the second exterior field-aware metal fill array 608 are arranged in the same metal layer and thus in the same plane as the illustrated portion of the passive component's metal layout 504. Additionally, the spaced metal fills of the interior field-aware metal fill array 530 are coupled to spaced metal fills of the first exterior field-aware metal fill array 602 in the first exterior area 542 via couplers 604 in a different metal layer that pass under or over the first metal feature 510. Also, the spaced metal fills of the interior field-aware metal fill array 530 are coupled to spaced metal fills of the second exterior field-aware metal fill array 608 in the second exterior area 544 via couplers 606 in a different metal layer that pass under or over the second metal feature 512. In other example embodiments, the couplers 604 and 606 are omitted, and the spaced metal fills of the interior field-aware metal fill array 530, the first exterior field-aware metal fill array 602, and the second exterior field-aware metal fill array 606 are uncoupled.

Figure 7:
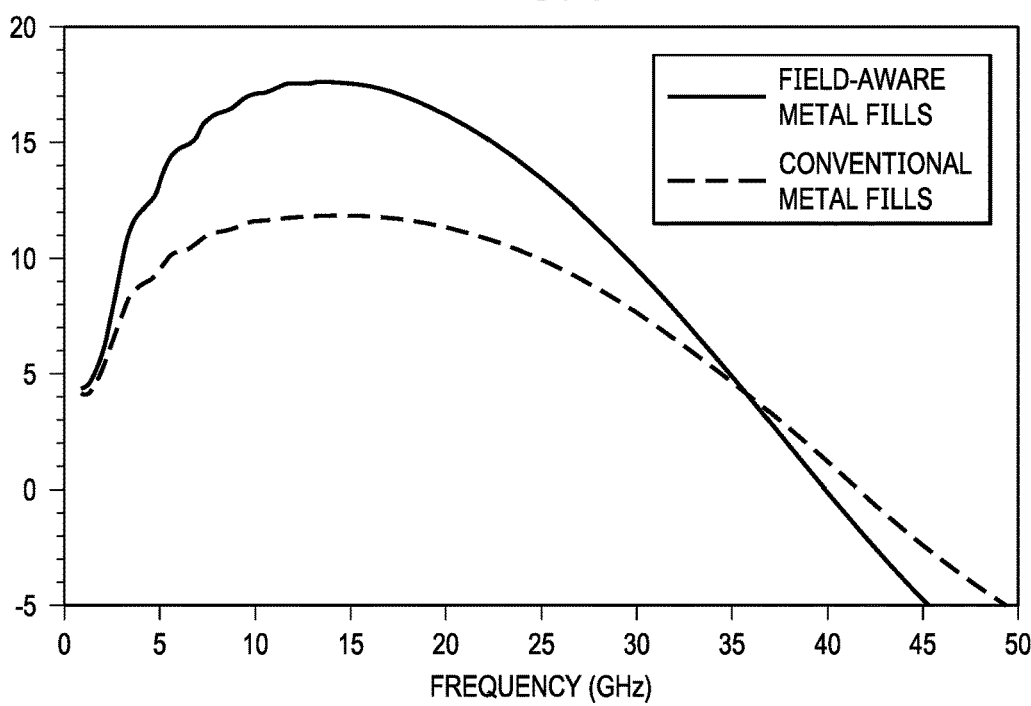
FIG. 7 is a graph of quality factor (Q) as a function of frequency due to field-aware metal fills and conventional metal fills.

FIG. 7 is a graph 700 of quality factor as a function of frequency due to field-aware metal fills and conventional metal fills. As shown in graph 700, the quality factor due to field-aware metal fills is higher from below 5 GHz to around 35 GHz compared to the quality factor due to conventional metal fills (e.g., rectangular metal fills as in FIGS. 3 and 4, sometimes referred to herein as dummy fills). With field-aware metal fills, the quality factor is increased by approximately 50% compared to conventional metal fills for the same structure and similar metal-fill density.

Figure 8:
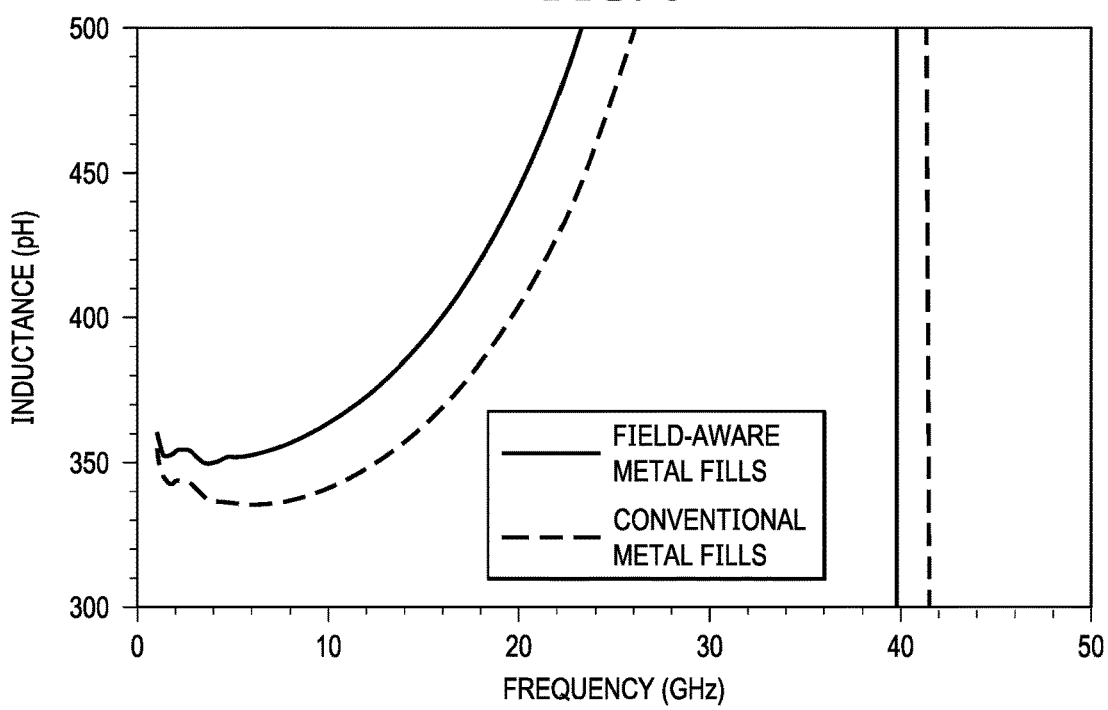
FIG. 8 is a graph of inductance as a function of frequency due to field-aware metal fills and conventional metal fills.

FIG. 8 is a graph 800 of inductance as a function of frequency due to field-aware metal fills and conventional metal fills. As shown in graph 800, the inductance produced in an inductor that includes field-aware metal fills is higher from below 5 GHz to around 30 GHz compared to the inductance produced by a comparable inductor that includes conventional metal fills. With field-aware metal fills, the inductance is increased by approximately 10% compared to conventional metal fills. This increase in inductance can be used to reduce the footprint of a passive components and related costs.

Figure 9:
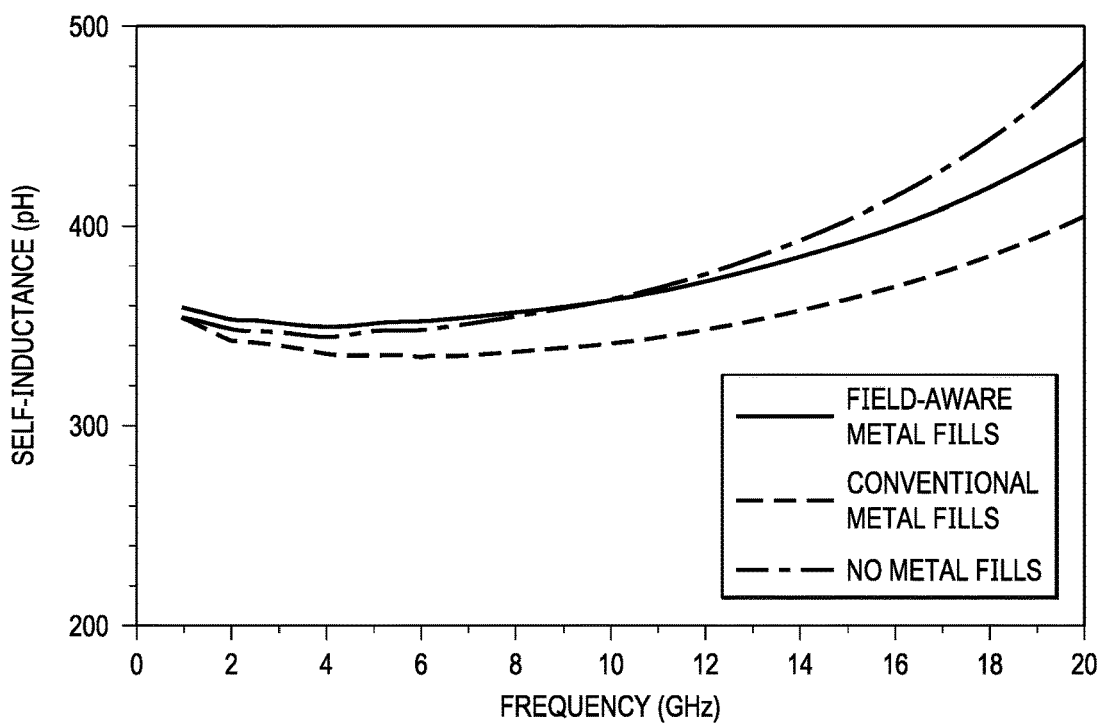
FIG. 9 is a graph of self-inductance as a function of frequency due to field-aware metal fills, conventional metal fills, and no metal fills.

FIG. 9 is a graph 900 of self-inductance (pH) as a function of frequency due to field-aware metal fills, conventional metal fills, and no metal fills. As shown in graph 900, the self-inductance of an inductor that includes field-aware metal fills is higher as a function of frequency compared to the self-inductance of a comparable inductor that includes conventional metal fills. In addition, graph 900 shows that use of no fills provides higher self-inductance than use of field-aware metal fills at frequencies higher than about 10 GHz. However, use of no fills may be prohibitive in some fabrication specifications. For relevant frequencies, the field-aware metal fills performs almost as well as no metal fills.

Figure 10:
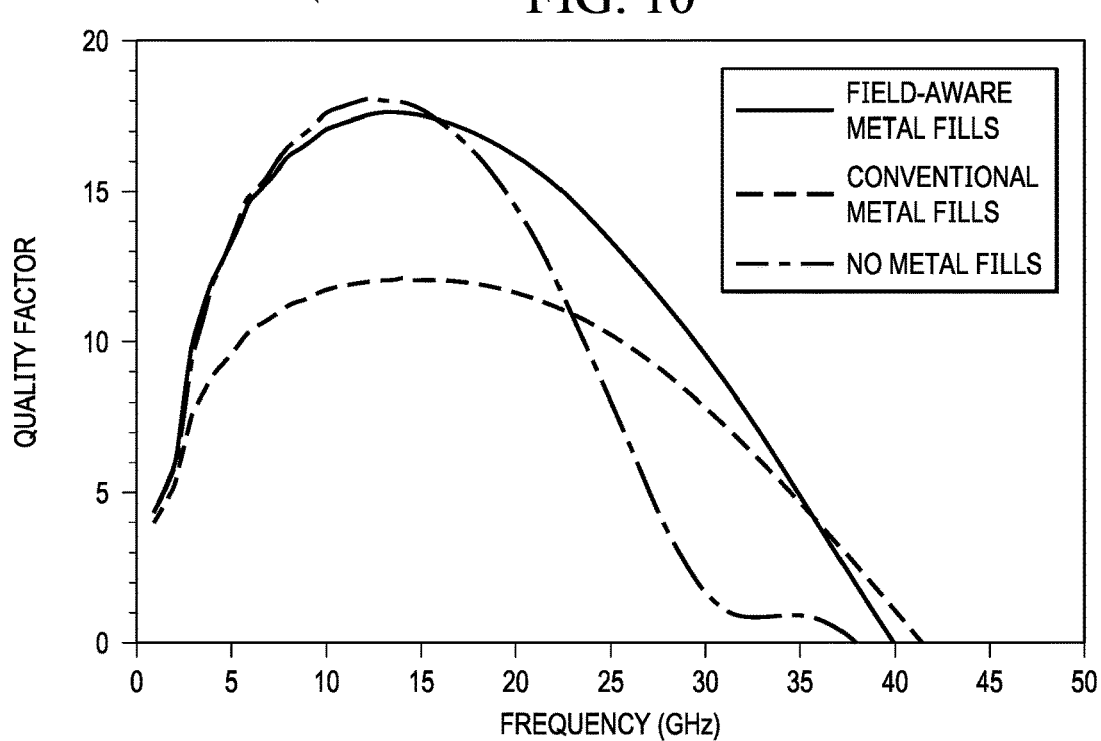
FIG. 10 is a graph of quality factor as a function of frequency due to field-aware metal fills, conventional metal fills, and no metal fills.

FIG. 10 is a graph 1000 of quality factor as a function of frequency for field-aware metal fills, conventional metal fills, and no metal fills. As shown in graph 1000, the quality factor of an inductor that includes field-aware metal fills is higher from below 5 GHz to around 35 GHz compared to the quality factor of a comparable inductor that includes conventional metal fills. In addition, graph 1000 shows that use of no fills provides higher quality factor than use of field-aware metal fills at frequencies of about 5-15 GHz. However, use of no fills may be prohibitive in some fabrication specifications. For relevant frequencies, the field-aware metal fills perform almost as well as no metal fill. As desired, field-aware metal fills are adjustable with regard to line width and/or spacing to improve the peak Q frequency point for the same fill-density.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. An integrated circuit, comprising:
   a passive component having a first metal feature and a second metal feature, the first metal feature and the second metal feature defining an interior area therebetween; and
   a set of spaced metal fill lines extending across the interior area, each of the metal fill lines being configured and oriented to carry a current in a same direction and orthogonal to current carried by the first metal feature and second metal feature.

2. The integrated circuit of claim 1, wherein the first metal feature includes a first interior edge and a first exterior edge, and the second metal feature includes a second interior edge and a second exterior edge.

3. The integrated circuit of claim 1, wherein the spaced metal fill lines include a first set of metal fill lines limited to the interior area.

4. The integrated circuit of claim 2, wherein the first exterior edge defines at least part of a first exterior area relative to the first metal feature, and the spaced metal fill lines include:
   a first set of metal fill lines limited to the interior area; and
   a second set of metal fill lines extending across the first exterior area.

5. The integrated circuit of claim 4, wherein metal fill lines of the first and second sets of metal fill lines are coupled together by a set of couplers that extend beneath the first metal feature.

6. The integrated circuit of claim 4, wherein the second exterior edge defines at least part of a second exterior area relative to the second metal feature, and the spaced metal fill lines include a third set of metal fill lines extending across the second exterior area.

7. The integrated circuit of claim 6, wherein metal fill lines of the first and third sets of metal fill lines are coupled together by a set of couplers that extend beneath the second metal feature.

8. The integrated circuit of claim 1, wherein the first metal feature is parallel to the second metal feature.

9. The integrated circuit of claim 8, wherein the first and second metal features carry current in opposite directions.

10. The integrated circuit of claim 1, wherein a first exterior edge of the first metal feature defines at least part of a first exterior area relative to the first metal feature, a second exterior edge of the second metal feature defines at least part of a second exterior area relative to the second metal feature, and the spaced metal fill strips include:
    a first set of metal fill strips limited to the interior area;
    a second set of metal fill strips extending across the first exterior area; and
    a third set of metal fill strips exterior across the second exterior area,
    wherein the first, second, and third sets of metal fill lines are uncoupled from each other.

11. The integrated circuit of claim 1, wherein the circuitry includes voltage-controlled oscillator (VCO) components, and the passive component is an inductor of the VCO.

12. The integrated circuit of claim 1, wherein the circuitry includes amplifier components, and the passive component is a transformer of the amplifier.

13. A system, comprising:
    a power management circuit;
    an integrated circuit coupled to the power management circuit and including:
       circuitry with a passive component having a metal layer with first and second metal features, each of the first and second metal features having an interior edge and an exterior edge, and the interior edges of the first and second metal features defining an interior area between the first and second metal features; and
       spaced metal fill lines extending across the interior area and oriented to carry respective currents in a same direction and orthogonal to current carried by the first and second metal features; and another circuit coupled to the integrated circuit, wherein the other circuit is configured to receive a signal from the integrated circuit responsive to operations of the circuitry.

14. The system of claim 13, wherein the integrated circuit is a radar control circuit, the circuitry includes a voltage-controlled oscillator (VCO), the passive component is an inductor, and the signal is a clock signal.

15. The system of claim 13, wherein the integrated circuit is a radar control circuit, the circuitry includes an amplifier, the passive component is an inductor or transformer, and the signal is an amplified signal.

16. The system of claim 13, further comprising:

a set of transmit antennas coupled to the integrated circuit;

a set of receive antennas coupled to the integrated circuit, wherein the other circuit is a microcontroller, and multi-object radar detection operations of the integrated circuit are a function of the inductor-based circuit.

17. The system of claim 13, wherein the spaced metal fill lines include a first set of metal fill lines limited to the interior area.

18. The system of claim 17, wherein the exterior edge of the first metal feature defines at least part of a first exterior area relative to the metal layer, the exterior edge of the second metal feature defines at least part of a second exterior area relative to the metal layer, and the spaced metal fill lines further include:

a second set of metal fill lines extending across the first exterior area; and a third set of metal fill lines extending across the second exterior area.

19. The system of claim 18, wherein metal fill lines of the first and second sets of metal fill lines are coupled together by a first set of couplers that extend beneath the first metal feature, and metal fill lines of the first and third sets of metal fill lines are coupled together by a second set of couplers that extend beneath the second metal feature.

20. The system of claim 18, wherein the first, second, and third sets of metal fill lines are uncoupled from each other.

* * * * *